US005554487A

United States Patent [19]

Ivory et al.

[11] Patent Number: 5,554,487
[45] Date of Patent: Sep. 10, 1996

[54] RESIST FORMATION MADE BY APPLYING, DRYING AND REFLOWING A SUSPENSION OF PHOTOCURABLE MATERIAL

[75] Inventors: Nicholas E. Ivory, Somerset; Michael Jeffries, Bristol; Robert J. Palmer; Wrenford J. Thatcher, both of Somerset, all of Great Britain

[73] Assignee: Coates Brothers PLC, Kent, Great Britain

[21] Appl. No.: 117,063

[22] PCT Filed: Mar. 13, 1992

[86] PCT No.: PCT/GB92/00451

§ 371 Date: Oct. 14, 1993

§ 102(e) Date: Oct. 14, 1993

[87] PCT Pub. No.: WO92/16877

PCT Pub. Date: Oct. 1, 1992

[30] Foreign Application Priority Data

Mar. 15, 1991 [GB] United Kingdom ............... 9105561

[51] Int. Cl.$^6$ .................................................. G03C 5/00
[52] U.S. Cl. ................. 430/311; 430/325; 430/270.14; 430/5; 427/375; 427/388.4
[58] Field of Search .................................. 430/311, 325, 430/270; 427/375, 388.4

[56] References Cited

U.S. PATENT DOCUMENTS

| 4,438,189 | 3/1984 | Geissler et al. | 430/280 |
| 4,478,932 | 10/1984 | Keane et al. | 430/314 |
| 4,510,173 | 4/1985 | Higashikawa et al. | 427/375 |
| 4,548,891 | 10/1985 | Riediker et al. | 430/325 |
| 4,692,396 | 9/1987 | Uchida | 430/284 |
| 4,877,818 | 10/1989 | Emmons et al. | 522/26 |
| 4,894,317 | 1/1990 | Maruyama et al. | 430/319 |
| 4,910,121 | 3/1990 | Riediker et al. | 430/281 |
| 5,026,625 | 6/1991 | Riediker et al. | 430/281 |

FOREIGN PATENT DOCUMENTS

| 20292219 | 11/1988 | European Pat. Off. . | |
| 20323563 | 7/1989 | European Pat. Off. . | |
| 20366333 | 5/1990 | European Pat. Off. . | |
| 20403170 | 12/1990 | European Pat. Off. . | |
| 3134123 | 3/1983 | Germany . | |
| 1290727 | 9/1972 | United Kingdom . | |
| 1417763 | 12/1975 | United Kingdom | 427/375 |
| 2013918 | 8/1979 | United Kingdom . | |

OTHER PUBLICATIONS

International Search Report for Internation Application No. PCT/GB 92/00451 dated Jun. 4, 1992.
United Kingdom Search Report for UK Application No. UK 9105561.6 dated May 7, 1991.

Primary Examiner—George F. Lesmes
Assistant Examiner—Laura Weiner
Attorney, Agent, or Firm—Wigman, Cohen, Leitner & Myers, P.C.

[57] ABSTRACT

A process for the formation of a patterned resist image upon a substrate comprises the steps of: (i) mechanically applying a layer of a suspension of a powdered solid photocurable material in a liquid carrier to the substrate; (ii) drying the resultant layer by evaporation of the liquid carrier and reflowing the powder, under the action of heat, to give a coherent film; (iii) imagewise exposing the dried film to radiation through a patterned mask whereby portions of the film exposed to radiation are cured; and (iv) subsequently developing the exposed film by removing unexposed portions thereof with an appropriate solvent.

2 Claims, No Drawings

RESIST FORMATION MADE BY APPLYING, DRYING AND REFLOWING A SUSPENSION OF PHOTOCURABLE MATERIAL

This invention is concerned with improvements in and relating to the formation of patterned resist masks in the manufacture of printed circuit boards and like electronic circuitry.

The use of resists in the manufacture of printed circuits is well established and such resists are used, for example, as etch resists, plating resists and solder resists. One common manner in which photoresists are employed comprises a so-called "photoimaging" technique. In such a technique, a layer of the resist upon an appropriate substrate is imagewise exposed to radiation through a patterned mask whereby portions of the resist exposed to radiation are cured (polymerised) and portions not so exposed remained uncured. The layer of resist, after exposure, is then "developed", i.e. by removing uncured (unexposed) portions of the resist by washing with an appropriate solvent. In order to obtain good resolution and definition in the exposure stage, it is most desirable that the patterned mask be placed in actual physical contact with the layers of resist.

A layer of resist may be formed upon a substrate by laminating a dry film resist to the substrate or by coating a solution of the resist onto the substrate and allowing it to dry by the evaporation of volatile solvent or diluent. The use of mechanical liquid coating techniques (such as curtain coating, dip coating, etc.) for applying a resist is generally more flexible and economic than is a laminating process. However the use of a solution of the resist material generally limits such a process to the use of appropriate organic solvents for dissolution of the resinous components of the photoresists and, nowadays, processes which make it possible to use aqueous solvents are often preferable.

It has now been found, in accordance with the present invention, that an acceptable patterned cured resist layer may be obtained by mechanically applying, in the first instance, a suspension or dispersion of a solid powdered resist material in a liquid carrier, to a substrate, subsequently removing the liquid carrier and then photoimaging the resultant layer of photoresist material.

According to the invention, therefore, there is provided a process for the formation of a patterned cured resist upon a substrate which comprises the steps of:

(i) mechanically applying a layer of a suspension of a powdered solid resist material in a liquid carrier to the substrate;

(ii) drying the resultant layer by evaporation of the liquid carrier and reflowing, under the action of heat, the powdered solid to give a coherent film on the substrate;

(iii) imagewise exposing the dried film to radiation through a patterned mask whereby portions of the layer exposed to radiation are cured; and (iv) subsequently developing the exposed film by removing unexposed portions thereof with an appropriate solvent.

The process of the invention is applicable to the formation of various patterned resist layers upon printed circuit boards, or like electronic circuits, during the course of their manufacture, for example etch resists, plating resists and solder resists, particularly the latter.

The basic material used in the process of the invention comprises a suspension of powdered solid photoresist material in a liquid carrier. The liquid carrier may be an organic solvent and/or water. In general, it is preferred to employ water as carrier, for environmental and safety reasons. In general terms, the suspension used in accordance with the invention will comprise from 20 to 80% by weight of powdered solid resist, preferably from 20 to 50% by weight thereof; the balance being formed by the liquid carrier. As will be appreciated it is generally desirable to maintain as high a level of powdered solid material in the suspension as possible so as to reduce the amount of energy necessary to remove the liquid by evaporation but, at the same time, consideration has to be given to question of applicability of the suspension as a whole. In this latter connection, any suitable mechanical process may be used to form a layer of the suspension upon the substrate, e.g. spray coating, dip coating, roller coating, curtain coating etc.

The powdered solid material suitably has a particle size of from 0.1 to 15 microns, preferably 0.5 to 8 microns.

The basic components of the photoresist material will generally be:

(i) an ethylenically unsaturated monomeric, oligomeric or polymeric material capable of polymerisation (curing) under the influence of electromagnetic radiation in the presence of a suitable initiator or catalyst; and (ii) a photoinitiator for initiating polymerisation of the photopolymerisable material under the influence of the electromagnetic radiation (generally UV light).

A wide variety of ethylenically unsaturated materials may be used as components of the photoresist materials of the invention provided, of course, that they are solid. A particularly preferred class of photopolymerisable material comprises the reaction products of epoxy resins (such as epoxy novolak resins or epoxy resins derived from the condensation of a bisphenol and epichlorohydrin) with an ethylenically unsaturated carboxylic acid (especially methacrylic acid or acrylic acid). Such reaction products, hereinafter simply termed "epoxy acrylates", contain a plurality of terminal ethylenically unsaturated groups which polymerise on exposure to radiation in the presence of an appropriate photoinitiator. Epoxy acrylates derived from epoxy novolak resins (including epoxy phenol novolak and epoxy cresol novolak resins) are particularly suitable for use as components in photoresists for use for preparing solder masks.

In order to render the epoxy acrylate material soluble or developable by aqueous alkaline solutions, the epoxy acrylate resin may be reacted with one or more dicarboxylic acids or anhydrides (serving to introduce free carboxyl groups into the final epoxy acrylate). In this case the dicarboxylic acid is used in a smaller amount than the ethylenically unsaturated acid, e.g. in an amount of from 33% to 81%, preferably 37% to 66%, mole % of the total acid (e.g. so that the final product has an acid value of from 45 to 110 mg KOH/g, preferably 50 to 90 mg KOH/g). Suitable dicarboxylic acid anhyrdrides for this purpose include succinic, itaconic, maleic and phthalic anhydrides:

In addition to the epoxy acrylate, the ethylenically unsaturated material may also comprise solid esters of acylic or methacylic acid with polyhydric alcohols such as pentaerythritol and dipentaerythritol, and of other polyepoxy compounds such as triglycidyl isocyanurate.

A wide variety of photoinitiators are known for use in photocurable systems and examples of these include anthraquinones such as 2-ethyl-anthraquinone, 2-methyl-anthraquinone, and 1-chloro-anthraquinone; thioxanthones such as 2,4-dimethyl-thioxanthone, 2,4-diethyl-thioxanthone and 2-chloro-thioxanthone, ketals such as benzyl-dimethyl-ketal and acetophenone-dimethyl-ketal; benzophenones and benzoine and ethers thereof. These photoinitiators can be used alone or in a mixture and may also be used together with photopolymerisation accelerators such as benzoic acid type accelerators or tertiary amine type accelerators.

In addition to the two above components, the solid photoresist material may also contain other components such as inorganic fillers, pigments, rheological additives (flow aids and degassing agents) and thermal curing agents and surfactants which may optionally be dispersed in the aqueous or solid phrases of the dispersion. Suitable or inorganic fillers include, for example, talc, silica and barium sulphate and these are suitably present in an amount of from 2 to 18% by weight, preferably 8 to 15% by weight, based on the weight of organic photocurable material. Examples of pigments which may be used are phthalocyanine pigments. Suitable thermosetting components which may be present in the solid material are epoxy resins containing two or more epoxy groups per molecule. These epoxy resins may, for example, be those derived from bisphenols (e.g. bisphenol A, F or S) or epoxy novolak resins, N-glycidyl type epoxy resins or alicyclic type epoxy resins. In addition, and optionally, an epoxy curing accelerator such as imidazole, a quaternary ammonium salt or methylol group containing compound may be present.

A thermosetting agent, when present, serves two purposes. It serves to produce a tougher final film by further cross-linking of the resist and it may also react with residual acidic groups of the photosensitive component to improve the hydrolyric stability and electrical properties of the resist. When present, such thermosetting agents may suitably form from 10 to 140% by weight, preferably 20 to 50% by weight of the photocurable organic resin. Suitable surfactants which may be used to stabilize the powder dispersion include polyethoxylated and/or polypropoxylated nonionic surfactants; quaternary ammonium cationic surfactants, and soap.

The powdered resist material is suitably prepared by blending the components e.g. as generally carried out in the manufacture of electrostatic powder paints, i.e. by extruding, ball-milling, three-roll milling or any other similar solid mixing process. The resultant material can then be granulated, e.g. using a flaking roller, followed by fine grinding and classification to give the desired particle size. The powder is thus suspended in the desired liquid carrier by high speed stirring (particularly with a Silverson high shear stirrer) and a suitable surfactant may be used to promote powder wetting and suspension stability.

The suspension of the solid photoresist in the liquid carrier may be applied to the substrate by any suitable mechanical coating method, as noted above. The coating thickness is suitably such as to yield, after drying by removal of carrier liquid, a film of 8 to 70 microns, preferably 10 to 10 microns.

The dried layer is then exposed to UV radiation through an appropriately patterned mask, and, after exposure, "developed" to remove uncured coating material. If the coating material contains a thermosetting agent, it may at this stage be further cured by heating, e.g. for a period 60 to 120 minutes at 120° to 140° C.

In order that the invention may be well understood the following Examples are given by way of illustration only.

EXAMPLE 1

A solid resin was prepared by reacting one equivalent of a bis-phenol-a derived epoxy resin (Shell Chemicals Epikote 1001) with one equivalent of acrylic acid. The resulting epoxy acrylate resin was then rendered aqueous alkali soluble by carboxylation with succinic anhydride to yield a resin with an acid value of 75 mg KOH/g (Resin A).

Resin A was then mixed in the following formulation using a 2 roll mill:

| Resin A | 90.3% |
| Photoinitiator I | 6.4 |
| (Ciba Geigy, Irgacure 907) | |
| Photoinitiator II | 0.8 |
| (Ward Blenkinsop, Quantacure ITX) | |
| Benzoin | 1.5 |
| Methylene Blue | 1.0 |

The solid material formed was then micronised to give a product with a particle size consistently below 10 μm. This powder was then mixed in the following formulation:

| Powdered Resist | 50% |
| Dispersion Agent | 1% |
| (BYK Chemie BYK-181) | |
| Deionised Water | 49% |

Mixing was carried out on a Silverson emulsification stirrer to yield a light blue coloured suspension of powdered resist in water.

The powder aqueous dispersion was then spray applied, using a venturi air assisted spray gun at 120 psi, to plain copper laminate which had previously been cleaned using silicon carbide brushes. After drying and reflowing the powder layer for 15 minutes at 70° C. a film thickness of 15 μm of resist was formed. This resist was then exposed imagewise through standard IPC etch resist artwork to 5000 mj/cm$^2$ from a medium pressure metal halide UV lamp. The image was developed using 0.6% w/w aqueous sodium carbonate solution at 40° C. yielding excellent resolution and an image true to the original photo tool. The work piece was then etched using acid ferric chloride solution to remove the areas of copper bared by the development of the resist. The circuit thus produced was then stripped of the cross linked resist by spraying with a 5% w/w aqueous sodium hydroxide solution at 50° C., to yield an accurate reproduction of the original artwork free of breaks or 'mouse bites'.

EXAMPLE II

A solder resist was prepared as follows:

| Resin A (from Example I) | 72.7% |
| Photoinitiator I | 5.8% |
| (Ciba Geigy Irgacure 641) | |
| Photoinitiator II | 0.7 |
| (Ward Biekinsop, Quantacure ITX) | |
| Benzoin | 1.4 |
| Talc | 9.8 |
| Triglycidyl Isocyanurate | 8.7 |
| Phthalocyanin Green | 0.9 |

The material was mixed in a heated screw extruder and the resulting solid micronised to give a powder of particle size less than 15 microns. This powder was then dispersed in the following formulation:

| Powder Resist | 45% |
| Dispersion Aid | 1.5% |
| (BYK Chemie, BYK 162) | |
| Deionised Water | 53.5% |

A Silverson high speed emulsification stirrer was used to affect dispersion to produce a light gree suspension of solid in water.

This suspension was sprayed onto IPC test circuit boards (which had been previously cleaned using a proprietary acidic microetch solution (Shipley Chemicals Microetch 748), to give, when dried reflowed to a coherent film, a dry film thickness of 30 microns. This resist coating was then imagewise exposed using IPC standard solder resist artwork. The areas shadowed by the artwork (i.e. uncross-linked areas) were developed away using 0.6% w/w potassium carbonate solution at 40° C. to give a precise reproduction of the artwork pattern. The developed resist was then given a final postbake (1.5 hours at 150° C.) and UV cure (1000 mJ/cm$^2$) to fully cross link the material and render it fully resistant to hot solder.

Once fully cured, the board was wiped with solder flux (Fry's No. 8 flux) and soldered over a solder wave at 280° C. for 10 seconds. The resist film showed good solder resistance with no blistering, solder pick up or resist stripping.

EXAMPLE III

A solid resin (Resin B) was prepared by reacting one equivalent of an epoxy cresol novolak resin with an equivalent of acrylic acid. The resulting epoxy cresol novolak acrylate was then carboxylated by reaction with a mixture of itaconic and hexahydrophthalic anhydrides to yield an aqueous alkali soluble resin with an acid value of 75 mg KOH/g.

This resin was then mixed in the following formulation using a heated screw extruder:

| | |
|---|---|
| Resin B | 90.3% |
| Photoiniator I | 3.3 |
| Photoinitiator II | 2.4 |
| Flow Aid | 3.0 |
| (Monsanto Inc. Modaflow 2) | |
| Methylene Blue 1.0 | 1.0 |

The solid produced was micronised to give a powder whose particle size was substantially less than 12 microns and which was dispersed using a Silverson emulsification stirrer in the following formulation:

| | |
|---|---|
| Powder Resist | 40% |
| Wetting Agent | 2% |
| (Decon Labs Ltd Decon 90) | |
| Deionised Water | 58% |

The light blue suspension formed was sprayed onto plain copper clad laminate (which had been previously cleaned and roughened using a pumice slurry cleaning machine), dried and reflowed to give an even film, and imagewise exposed through IPC plating resist test artwork. The image was developed using 0.6% w/w aqueous sodium carbonate solution at 40° C. The circuit pattern bared by this process was electrolytically plated with further copper and then with tin-lead, the resist showed good resistance to both plating solutions. Once the plading operation was completed, the resist film was stripped using 5% w/w aqueous sodium hydroxide solution and the copper bared by this process etched away using acid ferric chloride solution to leave a solder plated, copper circuit which showed excellent reproduction of the original artwork pattern.

EXAMPLE IV

Resin B (produced as described in Example III) was mixed into the following formulation using a 2 roll mill:

| | |
|---|---|
| Resin B | 82.8% |
| Photoinitiator | 5.0% |
| (Ethyl Anthroquinone) | |
| Benzoin | 1.4% |
| Silica | 9.8% |
| Phthalocyanin Green | 1.0% |

This solid was then ground using a blade grinder and classified, using a series of sieves to give a powder of particle size less than 15 microns. The powder was then dispersed using a Silverson high speed emulsification stirrer in the following formulation:

| | |
|---|---|
| Powder Resist | 40% |
| Wetting Agent | 3% |
| (Aerosol OS, Cyanamid Ltd) | |
| Deionised Water | 57% |

The light green coloured suspension was air sprayed onto IPC solder resist test circuit which had been previously cleaned with a silicon carbide brush scrubbing machine. The resist film was dried and the powder layer reflowed to yield a coating 25 microns thick, which was photoimaged through standard IPC solder test-artwork. The pattern of the artwork was then developed using 0.6% w/w aqueous potassium carbonate solution at 38° C. to give a true and accurate reproduction of the original artwork pattern. The resist film was then given a one and a half hour postbake at 150° C., followed by a final hard UV cure (2000 mj/cm$^2$) to produce its optimum resistive properties. When fully cured the film was soldered using a hot air solder levelling machine with Robertson's hot air levelling flux 395. The film showed excellent solder resistance, with no blistering, resist loss or solder pick up. The resist also showed good resistance to X-hatch adhesion and solvent rub tests.

We claim:

1. A process for the formation of a patterned resist upon a substrate which comprises the steps of:
   (i) mechanically applying a layer of a suspension of a powdered solid photocurable material in an aqueous carrier to the substrate, wherein said powdered solid photocurable material comprises the reaction product of an epoxy resin with an ethylenically unsaturated carboxylic acid, together with a photoinitiator;
   (ii) drying the layer applied in step (i) by evaporation of the aqueous carrier and reflowing the powder, under the action of heat, to give a coherent film;
   (iii) imagewise exposing the dried film to radiation through a patterned mask whereby portions of the film exposed to radiation are cured; and
   (iv) subsequently developing the exposed film by removing unexposed portions thereof with an appropriate solvent.

2. A process as claimed in claim 1 further comprising the step of preparing a solder mask on a primed circuit board during the course of fabrication thereof.

* * * * *